(12) United States Patent
Meiler et al.

(10) Patent No.: US 12,736,416 B2
(45) Date of Patent: Sep. 15, 2026

(54) METHOD AND DEVICE FOR DETERMINING A SEMICONDUCTOR TEMPERATURE OF A SEMICONDUCTOR ELEMENT, CONVERTER, ELECTRIC AXEL DRIVE, AND MOTOR VEHICLE

(71) Applicant: ZF Friedrichshafen AG, Friedrichshafen (DE)

(72) Inventors: Michael Meiler, Bayreuth (DE); Johannes Hager, Marktleugast (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 433 days.

(21) Appl. No.: 18/365,067

(22) Filed: Aug. 3, 2023

(65) Prior Publication Data

US 2024/0094065 A1 Mar. 21, 2024

(30) Foreign Application Priority Data

Aug. 4, 2022 (DE) ......................... 102022208136.6

(51) Int. Cl.
*G01R 31/00* (2006.01)
*G01K 13/00* (2021.01)

(52) U.S. Cl.
CPC ........... *G01K 13/00* (2013.01); *G01R 31/003* (2013.01); *G01R 31/007* (2013.01)

(58) Field of Classification Search
CPC .... G01R 31/003; G01R 31/007; G01K 13/00; G01K 7/427
See application file for complete search history.

(56) References Cited

U.S. PATENT DOCUMENTS

2012/0217795 A1 8/2012 Hasegawa et al.
2018/0109221 A1* 4/2018 Shin ....................... G01K 1/024
2020/0240850 A1 7/2020 He et al.
2021/0342512 A1* 11/2021 Kremer .................... G01K 7/42

FOREIGN PATENT DOCUMENTS

DE 10 2006 018 771 A1 10/2007
DE 102019212386 A1 * 2/2021 ............ H10W 42/80
DE 10 2021 201 363 A1 8/2022

OTHER PUBLICATIONS

Office Action dated Apr. 13, 2023 for German Patent Application No. 10 2022 208 136.6 (12 pp.), note: pp. 1 and 2 are English language Explanations to Section C. Result of Determination Document.

* cited by examiner

*Primary Examiner* — Jennifer Bahls
(74) *Attorney, Agent, or Firm* — Crowell & Moring LLP

(57) ABSTRACT

A method for determining a semiconductor temperature $T_j$ of a semiconductor element of a semiconductor module comprises ascertaining an estimated value of the semiconductor temperature $T_j$ using an optimizable model of a thermal behavior of the semiconductor module, reading a measured value of the semiconductor temperature $T_j$, optimizing the optimizable model using the measured value, providing the estimated value of the semiconductor temperature $T_j$, if the measured value is not available, and the measured value if the measured value is available for the point in time, and repeating the steps of the method for further points in time.

16 Claims, 4 Drawing Sheets

METHOD AND DEVICE FOR DETERMINING A SEMICONDUCTOR TEMPERATURE OF A SEMICONDUCTOR ELEMENT, CONVERTER, ELECTRIC AXEL DRIVE, AND MOTOR VEHICLE

CROSS-REFERENCE TO RELATED APPLICATION

This application claims priority to German Application No. DE 10 2022 208 136.6, filed on Aug. 4, 2022, the entirety of which is hereby fully incorporated by reference herein.

FIELD

The present invention relates to a method and a device for determining a semiconductor temperature of a semiconductor element, to a converter, an electric axle drive, and a motor vehicle.

BACKGROUND

The temperature of a semiconductor element can be measured to protect the semiconductor element from overheating. DE102021201363 describes a method suitable for this purpose for measuring an operating temperature of a power module.

Against this background, the present invention provides an improved method and an improved device for determining a semiconductor temperature of a semiconductor element, an improved converter, an improved electric axle drive, and an improved motor vehicle according to the main claims. Advantageous embodiments result from the dependent claims and the following description.

The described approach advantageously enables a determination of a temperature of a semiconductor element even if a direct measurement of the temperature is temporarily not possible.

Such a semiconductor element can be part of a semiconductor module, which comprises the semiconductor element and a cooler unit thermally coupled via a thermal path with the semiconductor element. A cooler unit can be understood, for example, as an active or passive cooler, as are typically used in conjunction with electrical circuits. A coolant can optionally flow through the cooler unit to increase a cooling capacity. Using the cooler unit, thermal energy generated by the operation of the semiconductor element can be dissipated from the semiconductor element. The semiconductor element can comprise, for example, one or more transistors. The semiconductor element can be a power semiconductor. The semiconductor module can be part of an electrical circuit which can be installed, for example, in a vehicle or a machine.

A method for determining a semiconductor temperature of a corresponding semiconductor element of a semiconductor module for a vehicle comprises the following steps:

Ascertaining an estimated value of the semiconductor temperature for a point in time using an optimizable model of a thermal behavior of the semiconductor module;

reading a measured value of the semiconductor temperature for the point in time via an interface if the measured value is available for the point in time, wherein the measured value represents a value directly or indirectly detected using a sensor unit;

optimizing the optimizable model using the measured value of the semiconductor temperature for the point in time if the measured value is available for the point in time;

providing a value representing a semiconductor temperature for the point in time using the estimated value of the semiconductor temperature if the measured value is not available for the point in time and using the measured value of the semiconductor temperature if the measured value is available for the point in time; and repeating the steps of the method for further points in time following the point in time.

The semiconductor temperature can be understood as an internal temperature or a barrier layer temperature of a semiconductor of the semiconductor element. The optimizable model can be understood as an algorithm or mathematical method for estimating a system variable, the semiconductor temperature here. For example, the optimizable model can be based on a known estimator or observer. The optimizable model can be understood as a model capable of learning, that is to say the optimizable model can depict the thermal behavior of the semiconductor module more and more accurately as a result of one or more optimization steps. In each step of optimizing, a current estimated value can be combined with a current measured value to minimize errors of the optimizable model. For this purpose, for example, correlations used by the optimizable model to ascertain the estimated value can be adapted. If no measured value is available for the current point in time, the step of optimizing can be omitted. In contrast to the estimated value, the measured value can have been measured directly or can have been derived from directly measured data. An accuracy of the measured value is typically higher than an accuracy of the estimated value. The measured value can be read in via the interface directly from the sensor unit or from a derivation device, which derives the measured value from other measured data, for example a voltage applied at the semiconductor element and a current flowing through the semiconductor element. There can be points in time at which either no measurement can be carried out or at which, for example, measured data cannot be further processed suitably. At these points in time, accordingly no measured value can be available. The estimated value can advantageously be used at these points in time. If the determination of the semiconductor temperature is required, for example, at a predetermined sequence of points in time, the steps of the method can be executed repeatedly at these points in time.

The method can comprise a step of detecting the measured value of the semiconductor temperature for the point in time using the sensor unit if the step of detection can be carried out using the sensor unit at the point in time. In this case, for example, the sensor unit can represent a temperature sensor. Additionally or alternatively, the step of detecting can comprise detecting at least one sensor value for deriving the measured value for the point in time using the sensor unit, if the detection can be carried out using the sensor unit at this point in time. In this case, the sensor unit can comprise, for example, a current sensor and a voltage sensor. The measured value can be derived directly from the at least one sensor value, for example, based on a previously known mathematical dependency between the at least one sensor value and the measured value. In this way, whenever a measurement is possible, a directly or indirectly measured value can be provided. The measured value can advantageously additionally be used for optimizing the optimizable model.

In the step of optimizing, a comparison can be carried out between the estimated value and the measured value of the semiconductor temperature and the optimizable model can be optimized using a result of the comparison. A deviation between the estimated value and the measured value can be recognized very easily via the comparison. The optimization of the optimizable model can be carried out using an optimization rule predetermined for the optimizable model. In this way, the deviation between the estimated value and the measured value can be minimized more and more at subsequent points in time.

The method can comprise a step of calculating a cooler temperature value of a cooler temperature of the cooler unit for the point in time using the measured value of the semiconductor temperature for the point in time. The step of calculating can be carried out if the measured value is available for the point in time. In the step of optimizing, the optimizable model can be optimized using the cooler temperature value. This can be advantageous if the optimizable model uses the cooler temperature to ascertain the estimated value of the semiconductor temperature. This can be the case, for example, if the cooler temperature represents a state variable of the optimizable model. The more accurately the cooler temperature can be estimated using the optimizable model, the more accurately the semiconductor temperature can also be estimated using the optimizable model.

For example, for this purpose the cooler temperature value can be calculated in the step of calculation using a Foster model of the thermal path. The Foster model suggests itself in this case as an established procedure for describing a heat transfer within a semiconductor element.

In the step of ascertaining, a cooler temperature estimated value of the cooler temperature of the cooler unit can be ascertained for the point in time using the optimizable model. In the step of optimizing, a comparison can be carried out between the semiconductor temperature estimated value and the semiconductor temperature value and the optimizable model can be optimized using a result of the comparison. A deviation between the semiconductor temperature estimated value and the semiconductor temperature value can be recognized very easily via the comparison. The optimizing of the optimizable model can be carried out using an optimizing rule predetermined for the optimizable model. In this way, the deviation between the semiconductor temperature estimated value and the semiconductor temperature value can be minimized more and more at subsequent points in time.

The method can comprise a step of reading a power loss value, which represents a power loss of the semiconductor element for the point in time. In the step of ascertaining, the power loss value can be used as an input variable for the optimizable model. The power loss may advantageously be detected easily and continuously using a suitable sensor unit.

In the step of ascertaining, a flow rate value of a coolant of the cooler unit can be ascertained for the point in time using the optimizable model. With knowledge of the flow rate of the coolant, the estimated value of the semiconductor temperature can be ascertained even more accurately.

The optimizable model can be based on a Foster model of the thermal path transferred into a state space representation. The Foster model is particularly well suitable to establish a relationship between the cooler temperature and the semiconductor temperature. The cooler temperature can advantageously also be estimated here using the optimizable model, so that a metrological detection of the cooler temperature is not required.

The optimizable model can comprise a Kalman filter. An established estimator can thus be used. Additionally or alternatively, the optimizable model can comprise a Luenberger observer. Known methods can also be used to implement such an observer. Additionally or alternatively, the optimizable model can comprise an artificial intelligence. A flexibility of the optimizable model may thus be increased, for example.

A virtual coolant temperature sensor may be implemented using the described method.

The approach presented here furthermore provides a device for determining a semiconductor temperature of a semiconductor element of a mentioned semiconductor module. The device is designed to carry out, activate, and/or implement the steps of a variant of a method presented here in corresponding devices. An object underlying the invention can also be achieved quickly and efficiently by this embodiment variant of the invention in the form of a device.

A device can be an electrical device, which processes electrical signals, for example sensor signals, and outputs control signals as a function thereof. The device can include one or more suitable interfaces, which can be designed as hardware and/or software. With a hardware design, the interfaces can be, for example, part of an integrated circuit in which functions of the device are implemented. The interfaces can also be separate integrated circuits or can at least partially consist of discrete components. With a software design, the interfaces can be software modules which are provided, for example, on a microcontroller in addition to other software modules.

A computer program product having program code is also advantageous, which can be stored on a machine-readable carrier such as a semiconductor memory, a hard drive memory, or an optical memory and can be used to carry out the method according to one of the above-described embodiments when the program is executed on a computer or a device.

In addition, the invention relates to a converter, in particular an inverter, for a motor vehicle having a corresponding device and a mentioned semiconductor module. The converter is distinguished in that the device is designed as described. For example, in this case the semiconductor module can comprise at least one power transistor of a bridge circuit for converting a DC voltage into an AC voltage.

In addition, the invention relates to an electric axle drive for a motor vehicle having at least one electrical machine, a transmission unit, and a converter. The electric axle drive is distinguished in that the converter is designed as described.

The transmission unit can include a transmission for reducing the speed of the electrical machine and a differential.

In addition, the invention relates to a motor vehicle having an electric axle drive and/or a converter. The motor vehicle is distinguished in that the electric axle drive and/or the converter is designed as described.

The invention will be explained in more detail by way of example on the basis of the appended drawings.

DETAILED DESCRIPTION

In the following description of preferred exemplary embodiments of the present invention, identical or similar reference signs are used for the elements illustrated in the various figures and acting similarly, wherein a repeated description of these elements is omitted.

Figure 1:
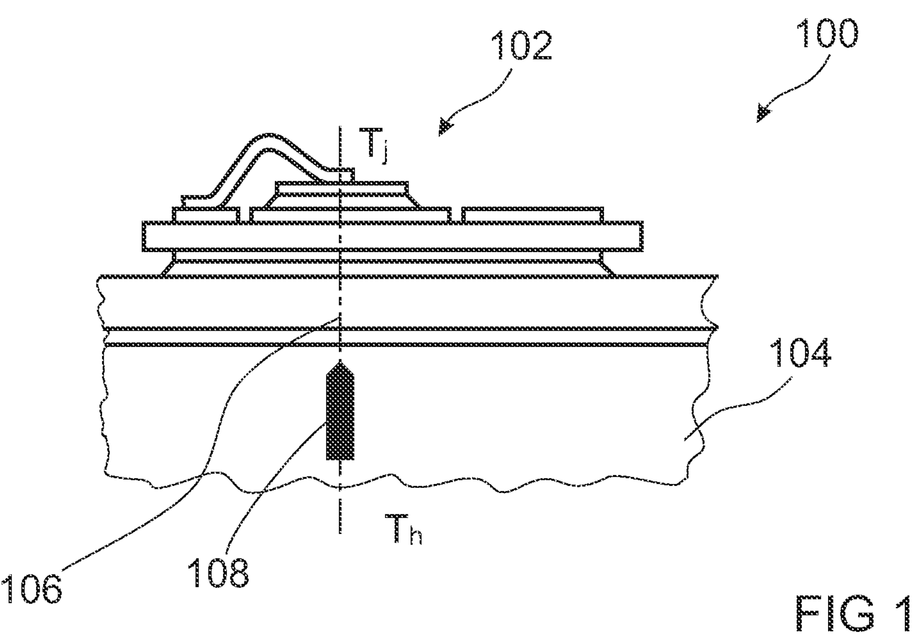
FIG. 1 shows a schematic representation of a semiconductor module according to one exemplary embodiment.

FIG. 1 shows a schematic representation of a semiconductor module 100 according to one exemplary embodiment. The semiconductor module 100 comprises a semiconductor element 102 and a cooler unit 104. The cooler unit 104 and the semiconductor element 102 are thermally coupled with one another via a schematically indicated thermal path 106. For example, the semiconductor element 102 is embodied as a power transistor and the cooler unit 104 is embodied as a cooler or heatsink, through which a coolant can optionally flow. The semiconductor element 102 heats up during operation. The cooler unit 104 is used to dissipate thermal energy from the semiconductor element 102. Tj represents the semiconductor temperature, thus the temperature of the semiconductor element 102 and Th represents the cooler temperature, thus the temperature of the cooler unit 104.

If the semiconductor element 102 is embodied as a power semiconductor, it is typically designed for a maximum semiconductor temperature which it can reach at most in operation and which is specified by the semiconductor producer. This maximum temperature is, for example, 150° C. for silicon IGBTs and 175° C. for silicon carbide MOSFETs. It is therefore to be ensured in the design of power-electronic drives that this temperature is not exceeded in any operating state.

The cooler temperature Th can be measured or estimated directly using a temperature sensor 108. If the cooler temperature Th is estimated, the temperature sensor 108 can advantageously be omitted.

Figure 2:
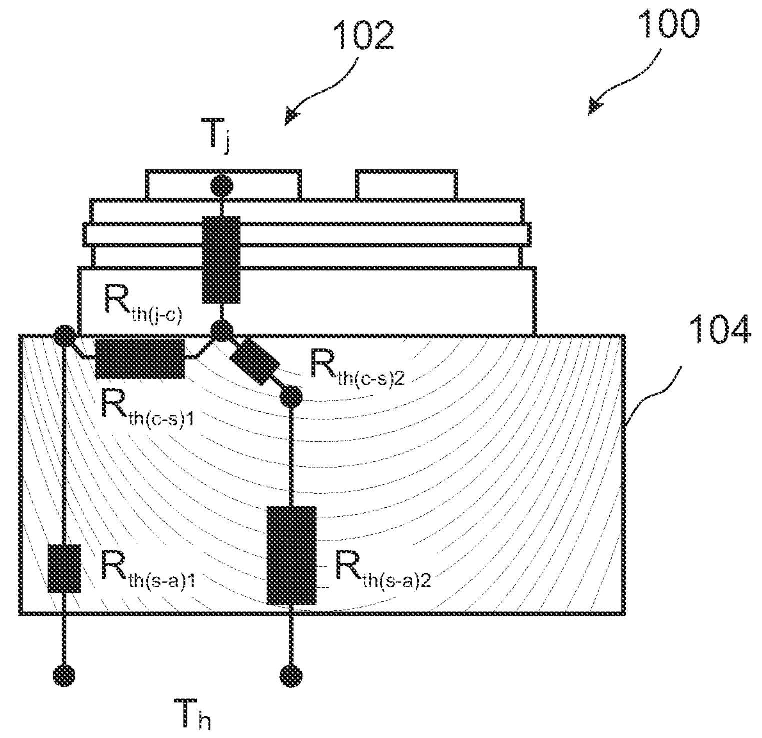
FIG. 2 shows a schematic representation of thermal impedances in a semiconductor module according to one exemplary embodiment.

FIG. 2 shows a schematic representation of thermal impedances Rth(j-c), Rth(c-s)1, Rth(c-s)2, Rth(s-a)1, Rth(s-a)2 in a semiconductor module 100 according to one exemplary embodiment. This can be a semiconductor module 100 having a semiconductor element 102 and a cooler unit 104, as is described on the basis of FIG. 1.

If accurate knowledge of the underlying cooling structure exists and the thermal impedances Rth(j-c), Rth(c-s)1, Rth(c-s)2, Rth(s-a)1, Rth(s-a)2 were accurately measured and determined before startup, the semiconductor temperature Tj of the semiconductor element 102 may be estimated if the cooler temperature Th is known. For this purpose, the cooler temperature Th of the cooler unit 104 can be measured or also estimated. For example, the semiconductor temperature Tj can then be calculated by means of mathematical modeling. Vice versa, the cooler temperature Th may be estimated if the semiconductor temperature Tj is known. For this purpose, the semiconductor temperature Tj can be measured directly or indirectly or also estimated. For example, the cooler temperature Th can then be calculated by means of mathematical modeling. In such a calculation, it is not necessary to attach a temperature sensor directly in or on the cooler unit 104.

Figure 3:
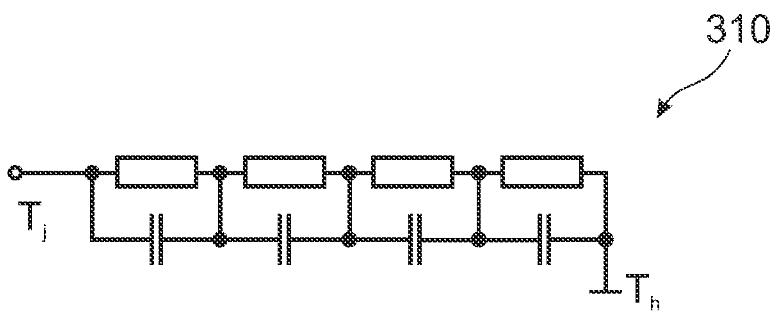
FIG. 3 shows a representation of a Foster model of a thermal path of a semiconductor module according to one exemplary embodiment.

FIG. 3 shows a representation of a Foster model 310 of a thermal path of a semiconductor module according to one exemplary embodiment. For example, the Foster model models the thermal path illustrated on the basis of FIG. 1. The Foster model 310 comprises a plurality of thermal elements connected in series, each of which comprises a parallel circuit of a thermal resistance and a thermal capacitance.

The cooler temperature Th is then used as a reference temperature for the Foster modeling of the thermal impedances (see image 4). Thus, by using the measured or estimated cooler temperature Th, the semiconductor temperature Tj may be calculated. Further input variables necessary for the calculation are, according to one exemplary embodiment, the power loss PDissipated in the semiconductor and the coolant flow QFlow if a coolant is used.

The Foster model 310 is then transferred into state space representation and Tj is calculated by means of the input variable vector u(t).

$$\dot{x}(t) = Ax(t) + Bu(t) \qquad \text{Equation 1}$$

$$y(t) = Cx(t) + Du(t)$$

$$\frac{d}{dt}x(t) = \begin{bmatrix} \frac{-1}{R_{th1}C_{th1}} & 0 & 0 & 0 & 0 \\ 0 & \frac{-1}{R_{th2}C_{th2}} & 0 & 0 & 0 \\ 0 & 0 & \frac{-1}{R_{th3}C_{th3}} & 0 & 0 \\ 0 & 0 & 0 & \frac{-1}{R_{th4}C_{th4}} & 0 \\ 0 & 0 & 0 & 0 & \frac{-1}{R_{th5}C_{th5}} \end{bmatrix} \times \begin{bmatrix} x_1 \\ x_2 \\ x_3 \\ x_4 \\ x_5 \end{bmatrix} + \begin{bmatrix} \frac{1}{C_{11}} & 0 \\ \frac{1}{C_{12}} & 0 \\ \frac{1}{C_{13}} & 0 \\ \frac{1}{C_{14}} & 0 \\ \frac{1}{C_{15}} & 0 \end{bmatrix} \times \begin{bmatrix} P_{Dissipated} \\ T_h \end{bmatrix} \qquad \text{Equation 2}$$

$$y(t) = \begin{bmatrix} 1 & 1 & 1 & 1 & 1 \end{bmatrix} \times \begin{bmatrix} x_1 \\ x_2 \\ x_3 \\ x_4 \\ x_5 \end{bmatrix} + \begin{bmatrix} 0 & 1 \end{bmatrix} \times \begin{bmatrix} P_{Dissipated} \\ T_h \end{bmatrix}$$

The division into five Foster links is only shown here by way of example in Equation 2. Theoretically, an arbitrarily fine division into Foster terms can take place since they do not represent physically “reasonable” values, but rather only depict an approximation of the thermal behavior.

Vice versa, the cooler temperature Th can be calculated by using the measured or estimated semiconductor temperature Tj.

Figure 4:
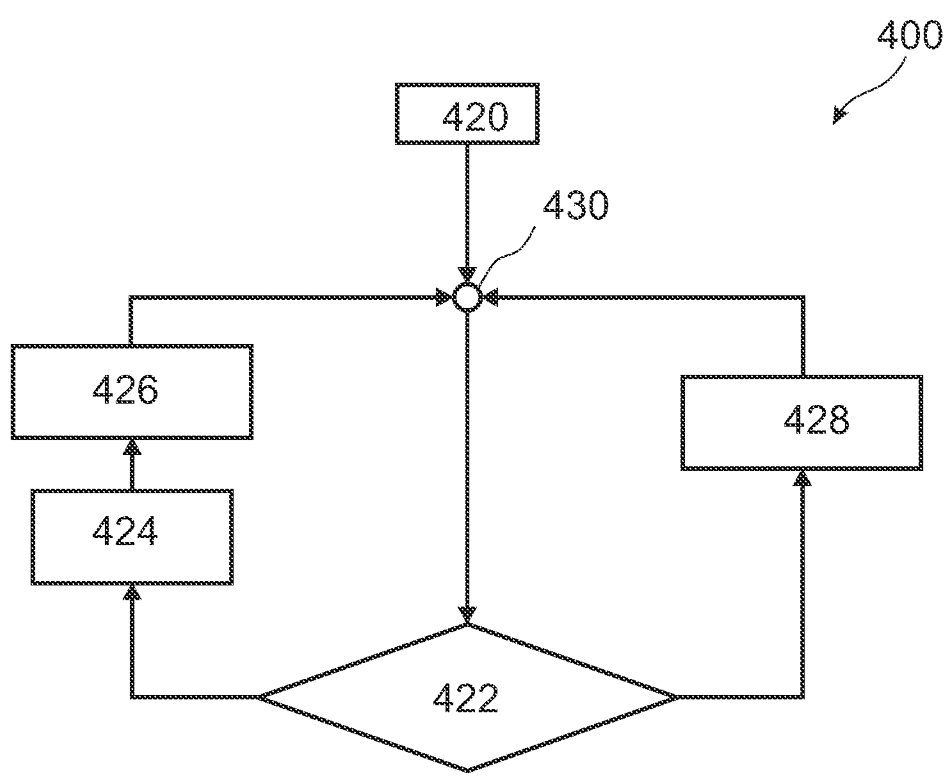
FIG. 4 shows a flow chart of a method for determining a semiconductor temperature of a semiconductor element according to one exemplary embodiment.

FIG. 4 shows a flow chart of a method 400 for determining a semiconductor temperature Tj of a semiconductor element according to one exemplary embodiment. For example, the semiconductor temperature Tj of the semiconductor element described on the basis of the preceding figures may thus be determined.

One advantage of the method is that costly measurement technology can be omitted, which would otherwise have to be installed on a circuit board and would cost both a large amount of money and a large amount of space. In addition, as module packages are increasingly becoming smaller, sensors suitable for direct semiconductor temperature measurement, such as NTC or PTC sensors (NTC: negative temperature coefficient, PTC: positive temperature coefficient), are no longer installed as standard features and are therefore not available.

It is also advantageously not necessary to compensate for these absent sensors with new temperature sensors, which could be arranged, for example, on a driver board. Instead, physical sensors for temperature measurement can be omitted both in the semiconductor module and on a circuit board carrying the semiconductor module.

Since the thermal impedances have a high level of dependence on the coolant temperature, thus the cooler temperature Th, this variable is of enormous importance for a correct calculation of the semiconductor temperature Tj. Both the semiconductor temperature Tj and the cooler temperature Th may advantageously be estimated or calculated, so that the physical temperature sensors otherwise necessary become obsolete. A suitable method or a suitable algorithm can be used for this purpose.

According to one exemplary embodiment, the possibility exists of measuring the semiconductor temperature Tj without temperature sensor directly in operation. In reality, however, this is not possible at every point in time, because of which a mathematical estimation is still necessary. Above all the cooler temperature Th is important for this purpose, as mentioned above, if the physical relationships between the temperatures are otherwise known.

To be able to calculate a correct semiconductor temperature Tj at the points in time at which it cannot be directly measured, vice versa, according to one exemplary embodiment, the cooler temperature Th is estimated at the measurement points in time and is assumed to be fixed only at points in time at which measurement is not possible.

FIG. 4 shows a schematic representation of a corresponding estimation and calculation of both the semiconductor temperature Tj and the cooler temperature Th. After a start 420 of the method 400, it is checked in a step 422 whether a measurement of the semiconductor temperature Tj is possible. Such a measurement is based according to one exemplary embodiment not on the temperature sensor, rather, for example, on a measurement of electrical variables at the semiconductor, such as current and voltage.

If it results from step 422 that a measurement is possible, in a step 224, the semiconductor temperature Tj is detected, measured according to one exemplary embodiment. A value which represents the semiconductor temperature Tj detected in step 422 is output according to one exemplary embodiment, for example to a monitoring device. In a step 426 of calculation, the cooler temperature Th is calculated. For example, the cooler temperature Th is calculated using the above-described Foster model and the semiconductor temperature Tj detected in step 224.

If it results from step 422 that a measurement is not possible, in a step 228, the semiconductor temperature Tj is ascertained, for example calculated by means of the cooler temperature Th. To ascertain the semiconductor temperature Tj, an optimizable model of the thermal behavior of the semiconductor module is used according to one exemplary embodiment. Such an optimizable model is based according to one exemplary embodiment on an estimator such as a Kalman filter. The semiconductor temperature Tj is thus estimated in step 228 according to one exemplary embodiment. A value which represents the semiconductor temperature Tj ascertained in step 428 is output according to one exemplary embodiment, for example to a monitoring device.

In this way, independently of whether a measurement of the semiconductor temperature Tj is possible, a value representing the semiconductor temperature Tj can be provided.

By means of a step 430 of repetition, steps 422, 424, 426, 428 are progressively repeatedly executed, for example at successive points in time.

An exemplary embodiment is described hereinafter, in which the semiconductor temperature Tj is ascertained in step 428 based on a mathematical estimation.

The mathematical estimation is solved according to one exemplary embodiment by a Kalman filter. This has the equation systems necessary for the estimation saved therein. Known equation systems for modeling the thermal path can be used here. The Kalman filter therefore perpetually calculates the semiconductor temperature Tj and compares it continuously to the measured values. As a result, even in spite of the temporary absence of measurement data, the Kalman filter can still calculate the semiconductor temperature Tj, for example based on equation 2 previously shown. However, in equation 2, the cooler temperature Th is still cited as an external input variable or measured variable.

To now have this input variable estimated by the filter, instead of carrying out external measurements, the input variable Th is now attributed to the state vector $\vec{x}(t)$. The equation system to be solved then changes as follows, or is expanded by a state variable:

Equation 3

$$\frac{d}{dt}x(t) = \begin{bmatrix} \frac{-1}{R_{th1}C_{th1}} & 0 & 0 & 0 & 0 & 0 \\ 0 & \frac{-1}{R_{th2}C_{th2}} & 0 & 0 & 0 & 0 \\ 0 & 0 & \frac{-1}{R_{th3}C_{th3}} & 0 & 0 & 0 \\ 0 & 0 & 0 & \frac{-1}{R_{th4}C_{th4}} & 0 & 0 \\ 0 & 0 & 0 & 0 & \frac{-1}{R_{th5}C_{th5}} & 0 \\ 0 & 0 & 0 & 0 & 0 & 0 \end{bmatrix} \times \begin{bmatrix} x_1 \\ x_2 \\ x_3 \\ x_4 \\ x_5 \\ x_6 \end{bmatrix} + \begin{bmatrix} \frac{1}{C_{11}} \\ \frac{1}{C_{12}} \\ \frac{1}{C_{13}} \\ \frac{1}{C_{14}} \\ \frac{1}{C_{15}} \\ \frac{1}{mc_p} \end{bmatrix} \times [P_{Dissipated}]$$

-continued $$y(t) = [1\ 1\ 1\ 1\ 1\ 1] \times \begin{bmatrix} x_1 \\ x_2 \\ x_3 \\ x_4 \\ x_5 \\ x_6 \end{bmatrix} + [0] \times [P_{Dissipated}]$$

In this case: $x_6 \approx T_h$ $\dot{m}$: mass flow $c_p$: specific heat capacity The new arrangement of the equation system results, with skilled selection of the Kalman parameters R, Q, in an automatic estimation of the cooler temperature $T_h$, which can correspond to the coolant temperature if a coolant is present. On the basis of the cooler temperature Th, the semiconductor temperature Tj is furthermore calculated if it results from step 422 that no measured values are available.

This enables a direct measurement of the semiconductor temperature Tj without a temperature sensor, for example, via the ascertainment of the temperature-dependent resistance in the semiconductor element. The cooler temperature Th may be calculated from the ascertained semiconductor temperature Tj of the semiconductor. A temporary calculation of the semiconductor temperature Tj is carried out according to one exemplary embodiment from the calculated cooler temperature Th, if no measured values are present. The measured variable to be determined, the calculated cooler temperature Th here, is part of the variable state space. This enables the calculation of the cooler temperature Th instead of a measurement of the cooler temperature Th.

According to one exemplary embodiment, this method comprises an additional estimation of the flow rate of a coolant through the cooler unit. The accuracy of the ascertainment of the semiconductor temperature Tj can thus be increased, since the thermal impedances also have a dependence on the coolant flow, although by far not as strongly as on the cooler temperature Th.

According to one exemplary embodiment, the algorithm which depicts the optimizable model, for example the Kalman filter, is expanded by one or more AI algorithms that can be taught. According to one exemplary embodiment, neural networks are thus additionally used to teach operating point-dependent temperatures and thus further refine the calculation of the temperatures. Instead of a Kalman filter, an observer may also be used, for example a Luenberger observer.

Figure 5:
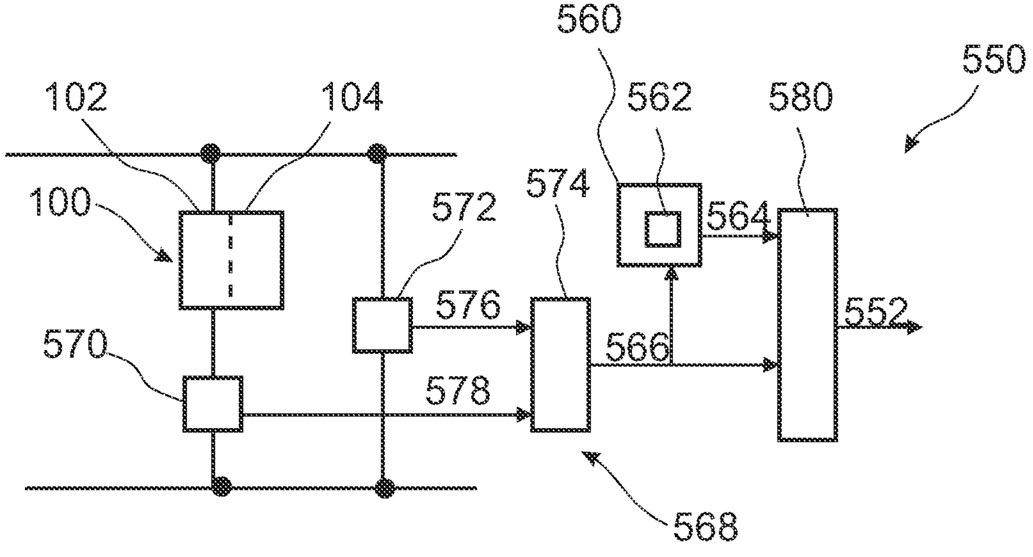
FIG. 5 shows a schematic representation of a device for determining a semiconductor temperature of a semiconductor element according to one exemplary embodiment.

FIG. 5 shows a schematic representation of a device 550 for determining a value 552, which represents a semiconductor temperature Tj of a semiconductor element 102 of a semiconductor module 100 according to one exemplary embodiment. This can be, for example, the semiconductor module described on the basis of FIG. 1, the temperature of which is determined with implementation of a method as described, for example, on the basis of FIGS. 4 and 6.

The device 550 includes an ascertainment unit 560, which is designed to ascertain an estimated value 564 of the semiconductor temperature Tj using an optimizable model 562 of a thermal behavior of the semiconductor module 100.

Furthermore, the device 550 is designed to read a measured value 566 of the semiconductor temperature Tj via an interface. For example, the measured value 566 is read via an interface to a sensor unit 568, which comprises by way of example a current measuring unit 570 for detecting a current flowing through the semiconductor element 102, a voltage measuring unit 572 for detecting a voltage dropping at the semiconductor element 102, and a processing unit 574, which is designed to determine the measured value 566 using the sensor values 576, 578 provided by the current measuring unit 570 and the voltage measuring unit 572. The sensor unit 568 is only shown by way of example. The sensor unit 568 can alternatively be designed to sense the measured value 566 directly, for example using a temperature sensor, or to derive it based on other sensor values. For example, the sensor unit 568 is designed to sense the internal electrical resistance of the semiconductor element 102 directly or indirectly and to derive the measured value 566 using a known correlation between the internal electrical resistance and the semiconductor temperature Tj.

If the measured value 566 is available for a point in time, the measured value 566 is provided according to one exemplary embodiment using a provision unit 580 as the value 552 representing the semiconductor temperature Tj.

If the measured value 566 is not available for the point in time, the estimated value 564 ascertained by the ascertainment unit 560 is, according to one exemplary embodiment, provided using the provision unit 580 as the value 552 representing the semiconductor temperature Tj.

To progressively update the optimizable model 562, the read measured value 566 is used according to one exemplary embodiment to optimize the optimizable model 562.

According to one exemplary embodiment, the device 550 is designed to provide a current value 552 in each case at successive points in time. For this purpose, a current estimated value 564 is ascertained at each of the respective points in time and a current measured value 566 is read in if available. Depending on whether or not a current measured value 566 is available, either the available measured value 566 or the currently ascertained estimated value 564 is provided as the current value 552.

According to one exemplary embodiment, the semiconductor element 102 is embodied as a transistor of a half-bridge of a converter. According to one exemplary embodiment, the converter comprises further corresponding transistors, wherein, for example, by suitable activation of the transistors, an input-side DC voltage can be converted into an AC voltage, for example, a three-phase AC voltage.

To detect the measured value 566, for example, the voltage dropping at the semiconductor element 102 or a voltage dropping at a series circuit made up of the semiconductor element and a diode is measured. Such a diode can be connected, for example, to a drain contact of the semiconductor element 102. In addition, for example, a current flowing through the semiconductor element 102, for example a current flowing from a drain contact to a source contact of the semiconductor element 102, is measured. For example, the processing unit 574 is designed to derive the measured value 566 based on a known mathematical dependency between the measured voltage, the measured current, and the semiconductor temperature Tj.

In this manner, direct sensing of the chip temperature of the semiconductor module 100, for example using an NTC sensor or a PTC sensor, can be omitted. Such sensors are based on electrical resistors which change their resistance value depending on their temperature. By measuring the resistance value, the temperature within the semiconductor module 100 can accordingly be concluded thanks to mathematical modeling. Temperature sensors on a driver board can thus advantageously be omitted. If such a temperature sensor is available, the measured value 566 can be provided by this temperature sensor, and the estimated value 564 can be provided, for example, as the value 552 only in the event of a temporary nonavailability of the measured value 566.

Figure 6:
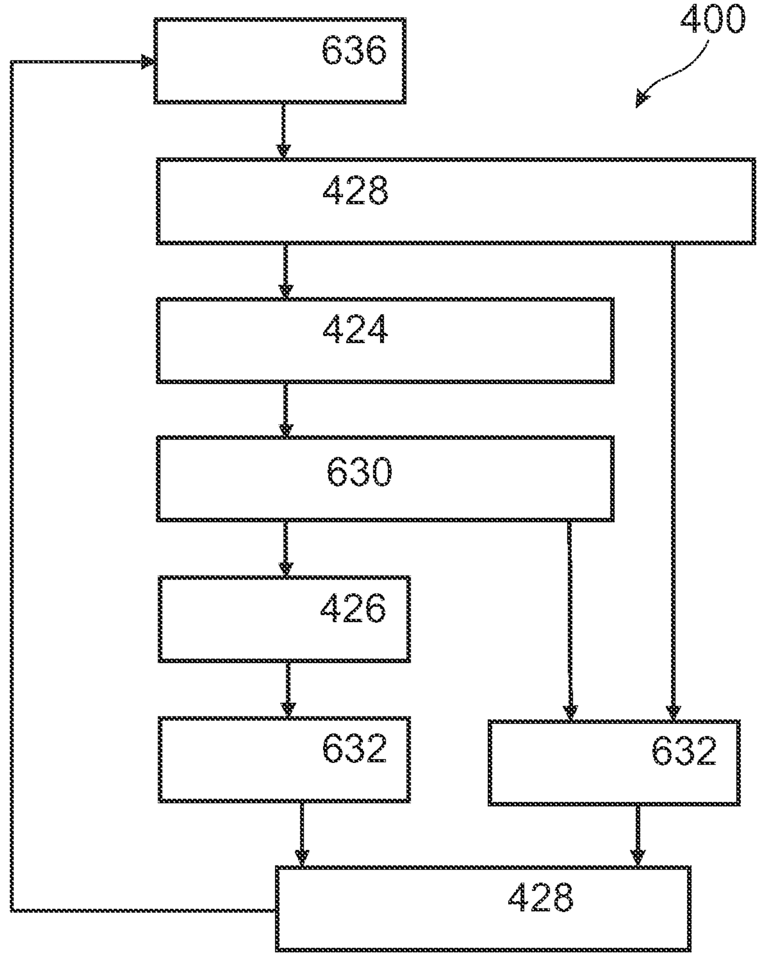
FIG. 6 shows a flow chart of a method for determining a semiconductor temperature of a semiconductor element according to one exemplary embodiment.

FIG. 6 shows a flow chart of a method 400 for determining a semiconductor temperature Tj of a semiconductor element according to one exemplary embodiment. For example, the semiconductor temperature Tj of the semiconductor element described on the basis of the preceding figures may thus be determined.

In a step 428, an estimated value for the semiconductor temperature for a, for example, current point in time is ascertained for this purpose. An optimizable model of a thermal behavior of the semiconductor module is used for this purpose, for example a Kalman filter, a Luenberger observer, or a suitable artificial intelligence.

In a step 630, a measured value of the semiconductor temperature is read for this point in time, for example the current point in time here, via an interface if the measured value is available for this point in time. The measured value is in this case a value which was detected directly or indirectly using a sensor unit.

In a step 632, the optimizable model is optimized using the measured value of the semiconductor temperature for this point in time if the measured value is available for the point in time. In this way, the estimated value can be estimated even better in a following step 428, for example for a later point in time following the current point in time.

In a step 634, a value representing the semiconductor temperature for this point in time is provided, thus here, for example, for the current point in time. If the measured value is available for this point in time, the value representing the semiconductor temperature is provided using the measured value. For example, the measured value is provided as the value representing the semiconductor temperature. If the measured value is not available for this point in time, the value representing the semiconductor temperature is provided using the estimated value. For example, the estimated value is provided as the value representing the semiconductor temperature.

For further points in time, the method is executed repeatedly, as is represented by a step 430 of repetition. In this way, for example, a current value representing the semiconductor temperature is provided for each of a series of successive points in time. An optimization of the optimizable model can advantageously be carried out upon each repetition, if a measured value suitable for the optimization is present.

According to one exemplary embodiment, the method 400 optionally comprises a step 424, in which the measured value read in step 630 is initially detected. For this purpose, the measured value is directly detected using a suitable measuring unit or derived based on sensor values detected by a sensor unit. For example, for this purpose initially an electrical resistance of the semiconductor element can be metrologically detected and the measured value can be derived from the electrical resistance using a known derivation rule.

According to one exemplary embodiment, in step 632, the estimated value is compared to the measured value of the semiconductor temperature for the current point in time. A result of the comparison, for example, a deviation between the estimated value and the measured value, is used to optimize the optimizable model using a result of the comparison.

According to one exemplary embodiment, the method 400 optionally comprises a step 426, in which a cooler temperature value of a cooler temperature of the cooler unit is calculated for the point in time, for example, for the current point in time here. The cooler temperature value is calculated using the measured value of the semiconductor temperature for this point in time, if the measured value is available for this point in time. A Foster model of the thermal path between the semiconductor element and the cooler unit is used for the calculation, for example. The cooler temperature value is used to optimize the optimizable model in step 632.

For example, for this purpose in step 428 furthermore a cooler temperature estimated value of the cooler temperature of the cooler unit is ascertained for this point in time using the optimizable model. In step 632, the cooler temperature estimated value and the cooler temperature value are compared to one another 632, for example, and the optimizable model is optimized, for example, using a result of the comparison or a deviation between the cooler temperature estimated value and the cooler temperature value.

According to one exemplary embodiment, the method 400 optionally comprises a step 636, in which a power loss value is read, which represents a power loss of the semiconductor element for this point in time, thus for the current point in time here, for example. In step 428, the power loss value is optionally used as an input variable for the optimizable model. This suggests itself, for example, if the optimizable model is based on a Foster model of the thermal path transferred into a state space representation.

Furthermore, a flow rate value of a coolant of the cooler unit for this point in time is optionally ascertained in step 428 using the optimizable model.

Figure 7:
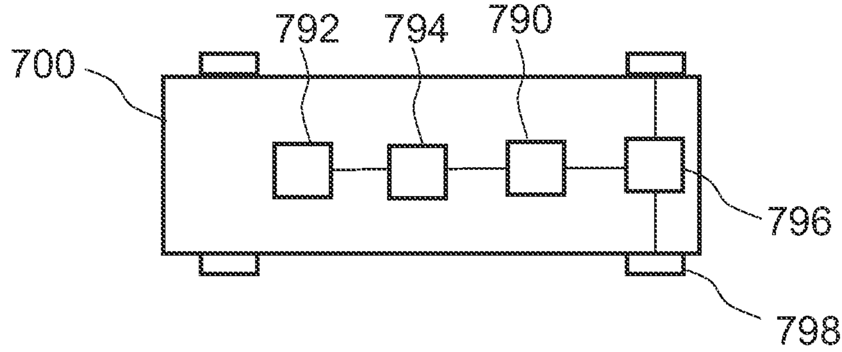
FIG. 7 shows a schematic representation of a vehicle according to one exemplary embodiment.

FIG. 7 shows a schematic illustration of a vehicle 700 according to one exemplary embodiment. For example, the vehicle 700 is embodied as a motor vehicle and includes an electric axle drive having an electrical machine 790. Electrical energy for operating the electrical machine 790 is provided by an energy supply device 792, for example a battery. For example, a direct current is provided by the energy supply device 792, which is converted using a converter 794 of the transmission unit into an alternating current, for example, a three-phase alternating current, and is provided to the electrical machine 790. The converter 794 comprises according to one exemplary embodiment at least one semiconductor module and a device for determining a semiconductor temperature of a semiconductor element of the semiconductor module, as are described on the basis of the preceding figures. With knowledge of the semiconductor temperature, for example, overheating of the semiconductor element can be prevented, for example, by temporarily throttling a drive power of the electrical machine 790. A shaft driven by the electrical machine 790 is coupled directly or using a transmission unit 796 to at least one wheel 798 of the motor vehicle 700. The motor vehicle 700 can therefore be propelled using the electrical machine 790. According to one exemplary embodiment, the electric axle drive comprises a housing, in which the converter 794, the electric machine 790, and the transmission unit 796 are arranged in integrated form.

LIST OF REFERENCE SIGNS

100 semiconductor module
102 semiconductor element
104 cooler unit
106 thermal path
108 temperature sensor
$T_j$ semiconductor temperature
$T_h$ cooler temperature
310 Foster model
400 method
420 start

422 step of checking
424 step of detecting
426 step of calculating
428 step of ascertaining
430 step of repeating
550 device for determining
552 value
560 ascertainment unit
562 optimizable model
564 estimated value
566 measured value
568 sensor unit
570 current measuring unit
572 voltage measuring unit
574 processing unit
576, 578 sensor values
580 provision unit
630 step of reading
632 step of optimizing
634 step of providing
636 step of reading
700 vehicle
790 electric machine
792 energy supply device
794 converter
796 transmission unit
798 wheel

The invention claimed is:

1. A method for determining a semiconductor temperature $T_j$ of a semiconductor element of a semiconductor module, wherein the semiconductor module comprises the semiconductor element and a cooler unit thermally coupled via a thermal path with the semiconductor element, the method comprising:

ascertaining, with a microcontroller, an estimated value of the semiconductor temperature $T_j$ for a point in time using an optimizable model of a thermal behavior of the semiconductor module;

reading, with the microcontroller, a measured value of the semiconductor temperature $T_j$ for the point in time via an interface in response to the measured value being available for the point in time, wherein the measured value represents a value detected directly or indirectly using a sensor unit;

optimizing, with the microcontroller, the optimizable model using the measured value of the semiconductor temperature $T_j$ for the point in time in response to the measured value being available for the point in time;

providing, with the microcontroller, a value representing the semiconductor temperature $T_j$ for the point in time using the estimated value of the semiconductor temperature $T_j$, in response to the measured value not being available for the point in time, and using the measured value of the semiconductor temperature $T_j$, in response to the measured value being available for the point in time;

throttling, with the microprocessor, a drive power of an electronic machine when the estimated value of the semiconductor temperature $T_j$ indicates overheating;

calculating a cooler temperature value of a cooler temperature $T_h$ of the cooler unit for the point in time using the measured value of the semiconductor temperature $T_j$ for the point in time;

optimizing the optimizable model using the cooler temperature value; and repeating the method for further points in time following the point in time.

2. The method according to claim 1, comprising:

detecting the measured value or at least one sensor value to derive the measured value of the semiconductor temperature $T_j$ for the point in time using the sensor unit in response to the detecting being able to be carried out using the sensor unit at the point in time.

3. The method according to claim 1, wherein optimizing the optimizable model comprises:

comparing the estimated value and the measured value of the semiconductor temperature $T_j$; and optimizing the optimizable model using a result of the comparison.

4. The method according to claim 1, comprising:

calculating the cooler temperature value using a Foster model of the thermal path.

5. The method according to claim 1, wherein ascertaining the estimated value of the semiconductor temperature $T_j$ comprises:

ascertaining a cooler temperature estimated value of the cooler temperature $T_h$ of the cooler unit for the point in time using the optimizable model; and wherein optimizing the optimizable model comprises:

comparing the cooler temperature estimated value and the cooler temperature value; and optimizing the optimizable model using a result of the comparison.

6. The method according to claim 1, comprising:

reading a power loss value which represents a power loss of the semiconductor element for the point in time; and using the power loss value as an input variable for the optimizable model when ascertaining the estimated value of the semiconductor temperature $T_j$.

7. The method according to claim 1, wherein the optimizable model is based on a Foster model of the thermal path transferred into a state space representation.

8. The method according to claim 1, wherein the optimizable model comprises a Kalman filter.

9. The method of claim 1, wherein reading a measured value of the semiconductor temperature $T_j$ for the point in time via an interface comprises:

measuring a current at the interface; and measuring a voltage at the interface;

wherein the measured value of the semiconductor temperature $T_j$ for the point in time is based on the measured current at the interface and the measured voltage at the interface.

10. A method for determining a semiconductor temperature $T_j$ of a semiconductor element of a semiconductor module, wherein the semiconductor module comprises the semiconductor element and a cooler unit thermally coupled via a thermal path with the semiconductor element, the method comprising:

ascertaining, with a microcontroller, an estimated value of the semiconductor temperature $T_j$ for a point in time using an optimizable model of a thermal behavior of the semiconductor module;

reading, with the microcontroller, a measured value of the semiconductor temperature $T_j$ for the point in time via an interface in response to the measured value being available for the point in time, wherein the measured value represents a value detected directly or indirectly using a sensor unit;

optimizing, with the microcontroller, the optimizable model using the measured value of the semiconductor temperature $T_j$ for the point in time in response to the measured value being available for the point in time;

providing, with the microcontroller, a value representing the semiconductor temperature $T_j$ for the point in time using the estimated value of the semiconductor temperature $T_j$, in response to the measured value not being available for the point in time, and using the measured value of the semiconductor temperature $T_j$, in response to the measured value being available for the point in time;

throttling, with the microprocessor, a drive power of an electronic machine when the estimated value of the semiconductor temperature $T_j$ indicates overheating; and repeating the method for further points in time following the point in time;

wherein ascertaining the estimated value of the semiconductor temperature $T_j$ comprises:

ascertaining a flow rate value of a coolant of the cooler unit for the point in time using the optimizable model.

11. A device for determining a semiconductor temperature $T_j$ of a semiconductor element of a semiconductor module, wherein the semiconductor module comprises the semiconductor element and a cooler unit thermally coupled with the semiconductor element via a thermal path, wherein the device is configured to:

ascertain an estimated value of the semiconductor temperature $T_j$ for a point in time using an optimizable model of a thermal behavior of the semiconductor module;

read a measured value of the semiconductor temperature $T_j$ for the point in time via an interface in response to the measured value being available for the point in time, wherein the measured value represents a value detected directly or indirectly using a sensor unit;

optimize the optimizable model using the measured value of the semiconductor temperature $T_j$ for the point in time in response to the measured value being available for the point in time;

provide a value representing the semiconductor temperature $T_j$ for the point in time using the estimated value of the semiconductor temperature $T_j$, in response to the measured value not being available for the point in time, and using the measured value of the semiconductor temperature $T_j$, in response to the measured value being available for the point in time;

throttle a drive power of an electronic machine when the estimated value of the semiconductor temperature $T_j$ indicates overheating;

calculate a cooler temperature value of a cooler temperature $T_h$ of the cooler unit for the point in time using the measured value of the semiconductor temperature $T_j$ for the point in time;

optimize the optimizable model using the cooler temperature value; and repeat the process for further points in time following the point in time.

12. An inverter comprising the device according to claim 11 and the semiconductor module.

13. The device of claim 11, wherein to read a measured value of the semiconductor temperature $T_j$ for the point in time via an interface, the device is configured to:

measure a current at the interface; and measure a voltage at the interface;

wherein to the measured value of the semiconductor temperature $T_j$ for the point in time is based on the measured current at the interface and the measured voltage at the interface.

14. An electric axle drive for a motor vehicle comprising:

at least one electric machine;

a transmission unit; and the inverter according to claim 12.

15. A non-transitory computer readable medium having stored thereon a computer program that, when executed by a computer, cause the computer to perform a method comprising:

ascertaining an estimated value of a semiconductor temperature $T_j$ for a point in time using an optimizable model of a thermal behavior of a semiconductor module;

reading a measured value of the semiconductor temperature $T_j$ for the point in time via an interface in response to the measured value being available for the point in time, wherein the measured value represents a value detected directly or indirectly using a sensor unit;

optimizing the optimizable model using the measured value of the semiconductor temperature $T_j$ for the point in time in response to the measured value being available for the point in time;

providing a value representing the semiconductor temperature $T_j$ for the point in time using the estimated value of the semiconductor temperature $T_j$, in response to the measured value not being available for the point in time, and using the measured value of the semiconductor temperature $T_j$, in response to the measured value being available for the point in time;

throttling a drive power of an electronic machine when the estimated value of the semiconductor temperature $T_j$ indicates overheating;

calculating a cooler temperature value of a cooler temperature $T_h$ of the cooler unit for the point in time using the measured value of the semiconductor temperature $T_j$ for the point in time;

optimizing the optimizable model using the cooler temperature value; and repeating the method for further points in time following the point in time.

16. The non-transitory computer readable medium of claim 15, wherein reading a measured value of the semiconductor temperature $T_j$ for the point in time via an interface comprises:

measuring a current at the interface; and measuring a voltage at the interface;

wherein the measured value of the semiconductor temperature $T_j$ for the point in time is based on the measured current at the interface and the measured voltage at the interface.

* * * * *